United States Patent
Schulze et al.

(10) Patent No.: US 9,716,227 B2
(45) Date of Patent: Jul. 25, 2017

(54) METHOD OF FORMING A GRAPHENE STRUCTURE

(71) Applicant: Infineon Technologies AG, Neubiberg (DE)

(72) Inventors: Hans-Joachim Schulze, Taufkirchen (DE); Peter Irsigler, Obernberg am Inn (AT); Guenther Ruhl, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/587,007

(22) Filed: Dec. 31, 2014

(65) Prior Publication Data
US 2016/0190446 A1    Jun. 30, 2016

(51) Int. Cl.
| | |
|---|---|
| H01L 51/00 | (2006.01) |
| H01L 21/02 | (2006.01) |
| H01L 21/324 | (2006.01) |
| H01L 29/16 | (2006.01) |
| C01B 31/04 | (2006.01) |

(52) U.S. Cl.
CPC ...... *H01L 51/0002* (2013.01); *C01B 31/0446* (2013.01); *C01B 31/0461* (2013.01); *H01L 21/0243* (2013.01); *H01L 21/02373* (2013.01); *H01L 21/02378* (2013.01); *H01L 21/02527* (2013.01); *H01L 21/02587* (2013.01); *H01L 21/02612* (2013.01); *H01L 29/1606* (2013.01); *H01L 51/0048* (2013.01)

(58) Field of Classification Search
None
See application file for complete search history.

(56) References Cited

U.S. PATENT DOCUMENTS

| | | | |
|---|---|---|---|
| 8,823,089 B2 | 9/2014 | Schulze et al. | |
| 2012/0258587 A1* | 10/2012 | Kub | C01B 31/0446 438/610 |
| 2012/0261673 A1 | 10/2012 | Schulze et al. | |
| 2014/0272309 A1* | 9/2014 | Davis | H01L 29/41 428/161 |
| 2015/0357189 A1* | 12/2015 | Davis | H01L 21/28512 257/29 |

OTHER PUBLICATIONS

Th. Seyller et al., physica status solidi, Apr. 7, 2008: "Epitaxial Graphene: a new Material", 10 pages.
Luxmi et al., Journal of Electronic Materials, vol. 38, No. 6, Jun. 2009: "Temperature Dependence of Epitaxial Graphene Formation on SiC(0001)", pp. 718-724.
Konstantin V. Emtsev et al., nature materials Letters, Feb. 8, 2009: „ Towards wafer-size graphene layers by atmospheric pressure graphitization of silicon carbide, pp. 203-207.

(Continued)

*Primary Examiner* — Khaja Ahmad
(74) *Attorney, Agent, or Firm* — Viering, Jentschura & Partner mbB

(57) ABSTRACT

In various embodiments, a method of forming a graphene structure is provided. The method may include forming a body including at least one protrusion, and forming a graphene layer at an outer peripheral surface of the at least one protrusion.

19 Claims, 11 Drawing Sheets

(56) References Cited

OTHER PUBLICATIONS

Jakub Kedzierski et al., IEEE Transactions on Electron Devices, vol. 55, No. 8, August 2008: "Epitaxial Graphene Transistors on SiC Substrates", pp. 2078-2085.

F. Bonaccorso et al., Materials Today, vol. 15, Issue 12, Dec. 2012, pp. 564-589: "Production and processing of graphene and 2d crystals".

J.-H. Lee et al., Sciencexpress Reports, Apr. 2014: "Wafer-Scale Growth of Single-Crystal Monolayer Graphene on Reusable Hydrogen-Terminated Germanium", downloaded from www.sciencemag.org on Apr. 7, 2014.

* cited by examiner

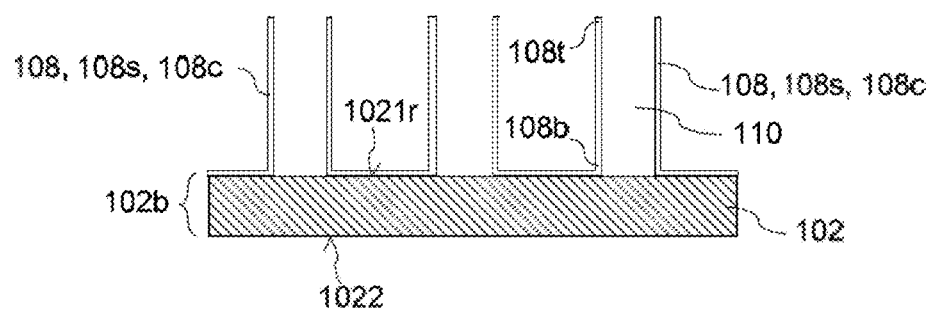
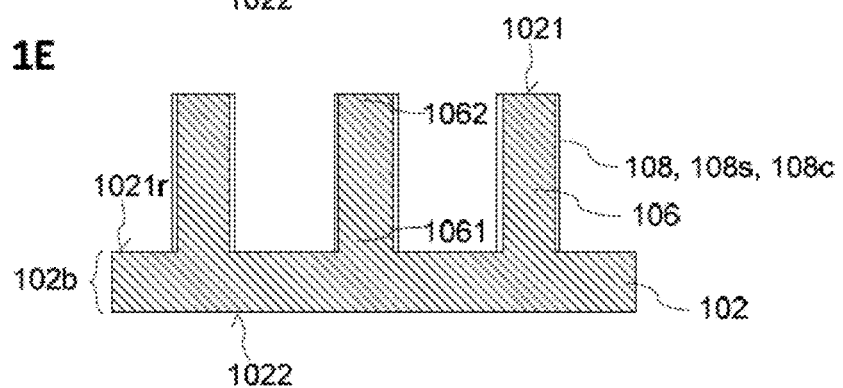

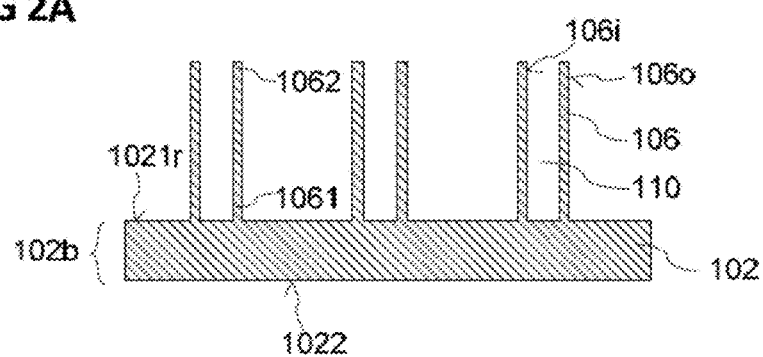
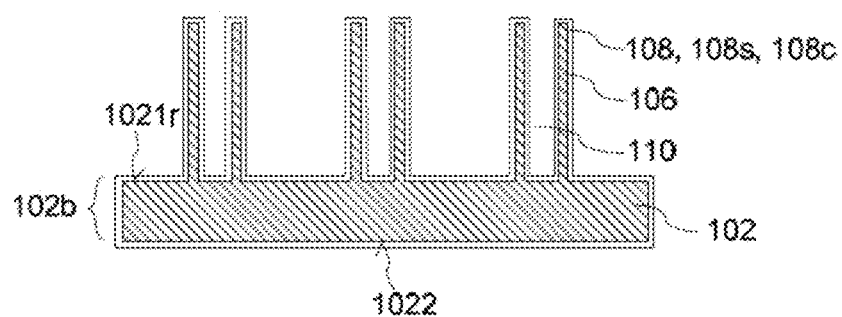

METHOD OF FORMING A GRAPHENE STRUCTURE

TECHNICAL FIELD

Various embodiments relate generally to a method of forming a graphene structure.

BACKGROUND

Carbon nanotubes may have advantageous properties, for example regarding their electrical or thermal conductivity, or regarding their hardness, e.g. a mechanical hardness. At present, carbon nanotubes are formed in a way that may make it difficult to form carbon nanotubes with a defined length and/or with a defined diameter. Furthermore, a shape of the carbon nanotubes may be restricted to circular hollow cylinders.

SUMMARY

In various embodiments, a method of forming a graphene structure is provided. The method may include forming a body including at least one protrusion. The method may further include forming a graphene layer at an outer peripheral surface of the at least one protrusion.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 1A to 1E show various stages of a method of forming a graphene structure in accordance with various embodiments;

FIGS. 2A and 2B show two stages of a method of forming a graphene structure according to various embodiments;

DESCRIPTION

Figure 1A:
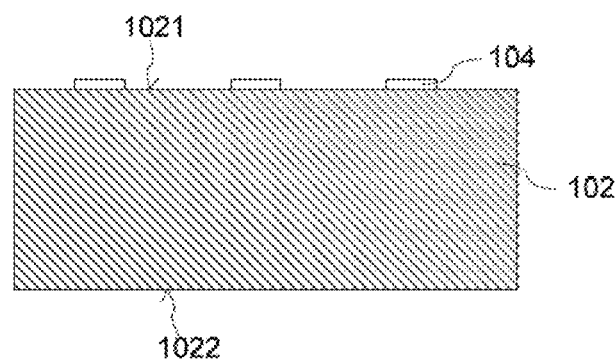

The following detailed description refers to the accompanying drawings that show, by way of illustration, specific details and embodiments in which the invention may be practiced.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The words "cylinder", "cylindrical" and the like are to be understood as referring to a surface traced by a straight line moving parallel to a fixed straight line and intersecting a fixed planar closed curve. In other words, a cylinder may not only include three-dimensional structures with a circular or elliptical cross section, but also with cross sections an outline of which is of any other regular or irregular shape, e.g. a polygon (e.g. a triangle, rectangle, square, hexagon, etc.), a half-moon shape, etc., as long as the outline of the cross section (the curve in the fixed plane) is closed.

The term "at least one graphene layer" as used herein means at least one 1-atom thick layer of carbon atoms and thus includes a single-atom thick layer of carbon atoms and a multi-atom thick layer of carbon atoms such as a 2-atoms thick layer, a 3-atoms thick layer, a 4-atoms thick layer, a 5-atoms thick layer, a 6-atoms thick layer of carbon atoms, for example.

In the following, a graphene layer and a graphene structure may be referred to. The (e.g. at least one) graphene layer may be considered as forming a very thin, e.g. only up to a few atoms (see above) thick layer, i.e. to be formed extending in two layer dimensions and to have a negligible extent in a third dimension. The graphene layer may however be arranged also in a third dimension, it may for example be bent and/or linked in the third dimension, thereby forming a three-dimensional graphene structure. The graphene layer may thus be considered as being shaped in the third dimension to form the graphene structure, and the graphene structure may be considered as a three-dimensional arrangement of the essentially two-dimensional graphene layer.

In various embodiments, a method of forming carbon nanotubes in a defined way may be provided.

The carbon nanotubes formed using a method according to various embodiments may for example be used for forming switchable (e.g. electronic) devices, e.g. transistors.

In various embodiments, a protrusion may be formed on or from a carbon-containing semiconductor body. At a surface of the protrusion, a graphene layer may be formed.

In various embodiments, a carbon-containing semiconductor (e.g. SiC) substrate may be structured, e.g. by forming trenches in the substrate, in such a way that one or more protrusions, e.g. pillar- and/or mesa-shaped structures (which may be referred to as mesa structures), e.g. SiC mesa structures, may be formed. Subsequently, the structured substrate may be annealed, such that a surface of the at least one mesa structure may be converted to a graphene layer.

In other words, a carbon-containing (e.g. SiC) substrate may be used for forming a protrusion. The substrate with the protrusion may be subjected to an annealing process, which may lead to a formation of a graphene layer on an exposed surface of the protrusion. The graphene layer may form by thermal decomposition of the substrate material (e.g., silicon carbide). This process for forming the graphene layer may also be referred to as epitaxy, expitaxial formation or epitaxial growth of the graphene layer, even though the carbon used for forming the graphene layer may be provided by the carbon-containing semiconductor material itself and not deposited in a deposition process that may typically be referred to as epitaxial deposition, epitaxy, expitaxial formation or epitaxial growth.

In one or more embodiments, a very precise structurability of semiconductor substrates, for example using extreme ultraviolet- or electron beam lithography, may be exploited for forming a graphene structure with a precisely pre-defined shape. First, a precisely shaped protrusion may be formed from and/or on a carbon-containing substrate, e.g. an SiC substrate, and thereafter the graphene structure may be formed at or on an outer surface of the precisely shaped protrusion, thereby creating a precisely shaped graphene structure. An annealing process may be used for the forming of the graphene structure.

In various embodiments, a method of forming carbon nanotubes in a well-defined way may be provided. The carbon nanotubes may be formed by forming at least one graphene layer surrounding, e.g. wrapping, a silicon carbide mesa structure, e.g. a pillar shaped silicon carbide mesa structure. The carbon nanotubes may, in various embodiments, be filled with silicon carbide, which may be remaining SiC material of the mesa structure(s). Alternatively, the silicon carbide may be removed from an inside of the carbon nanotubes.

In various embodiments, a plurality of pillars containing silicon carbide may be formed. From the plurality of pillars, a plurality of carbon nanotubes may be formed by thermal decomposition of the silicon carbide at an outer peripheral surface of the plurality of pillars.

In various embodiments, a graphene structure may be formed by pre-shaping a body to have a peripheral surface with a shape (e.g. a cylindrical shape) desired for the graphene structure, and by forming a graphene layer on the peripheral surface. In the following, various embodiments may be described in detail with reference to the figures.

In the embodiments, the graphene layer may be formed on an outer peripheral surface (e.g. of a protrusion). Alternatively, the graphene layer may be formed on an inner peripheral surface (e.g. of an opening formed in a body), and a portion of the body outside the graphene layer (which may form a closed surface) may be removed, or the graphene layer may be formed on an inner peripheral surface of an opening formed in a body, wherein the opening may have such a specific diameter that a carbon nanotube may form, in other words, the diameter of the opening may fulfill a specific relation.

In the embodiments, the body, or at least a peripheral surface of the protrusion, may be described as including or consisting of carbon-containing semiconductor material. Alternatively, the body, or at least a peripheral surface of the protrusion and/or the opening, may for example be a metal with carbon dissolved in its bulk above its dissolution limit (the carbon may for example be introduced by codeposition or by solution from a carbon-containing gas at elevated temperatures). After an annealing/cooling sequence, graphene may be formed by carbon segregation to the metal surface. And in yet another alternative, the peripheral surface of the protrusion and/or the opening may be catalytic, e.g. include or consist of copper (Cu), nickel (Ni) or germanium (Ge), and graphene may be deposited on the catalytic surface by chemical vapor deposition from a carbon-containing gas. All these materials may be wet chemically etched selectively to graphene. Graphene deposition using metals may yield polycrystalline graphene. Germanium may easily be etched anisotropically. CVD on single-crystalline germanium (Ge) may yield single-crystalline graphene. As a consequence, unless specifically excluded and/or unfeasible, the various embodiments described below may be carried out by applying one or more of the above described modifications.

Figure 1B:
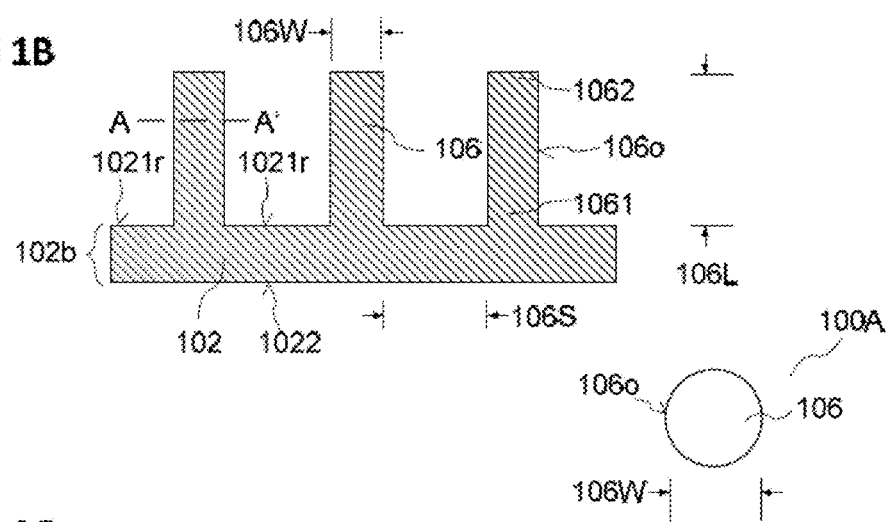
Figure 1C:
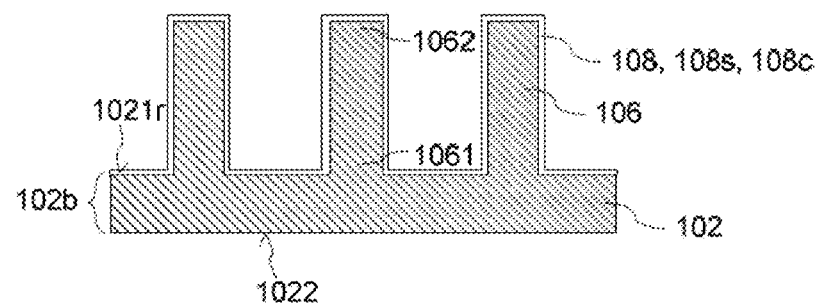

FIGS. 1A to 1C show various stages of a method of forming a graphene structure in accordance with various embodiments.

As shown in FIG. 1A, a semiconductor body 102 may be provided. The semiconductor body 102 may have a first surface 1021 on a first side, also referred to as a top surface and a top side, respectively, and a second surface 1022 on a second side, also referred to as a bottom surface and a bottom side, respectively, opposite the first surface 1021 (and opposite the first side).

In various embodiments, the semiconductor body 102 may include carbon. The semiconductor body 102 may include, consist of or essentially consist of a semiconductor material including carbon. The semiconductor material including carbon may be referred to as a carbon-containing semiconductor material. The semiconductor body 102 may for example include, consist of or essentially consist of silicon carbide (SiC). Alternatively, the semiconductor body 102 may for example include, consist of or essentially consist of germanium carbide (GeC). In various embodiments, the semiconductor body 102 may be a semiconductor substrate, e.g. a semiconductor wafer, e.g. a silicon carbide wafer. In various embodiments, the semiconductor body 102 may include at least one material that may not be a semiconductor material, or a semiconductor material that may not contain carbon. For example, a layer of the carbon-containing semiconductor material may be formed on a carrier (which may or may not include a semiconductor material and may or may not include carbon). In that case, a body formed from the carrier and the layer of the carbon-containing semiconductor material may be considered as the semiconductor body 102.

In various embodiments, the semiconductor body 102 may at least partially be doped. The semiconductor body 102 may for example be, e.g. partially, doped as a p-type semiconductor and/or as an n-type semiconductor. In various embodiments, the semiconductor body 102 may include an epitaxial layer of the semiconductor material.

On a surface of the semiconductor body 102, e.g. on the first surface 1021 of the semiconductor body 102, a masking structure 104 may be arranged. The masking structure 104 may include any material that is suitable for protecting the semiconductor body 102 underneath the masking structure 104 from being removed during a subsequent structuring process. The masking structure 104 may for example include or consist of a hard mask, a photoresist or a resist used in electron beam lithography.

In various embodiments, the masking structure 104 may be formed having a two-dimensional structure (e.g. a two-dimensional distribution on the first surface 1021 of the semiconductor body 102) corresponding to a cross section of one or more protrusions 106 (see FIG. 1B) to be formed from the semiconductor body 102. A patterning of the masking structure may for example include extreme ultraviolet- or electron beam lithography.

The semiconductor body 102 may in various embodiments be subjected to a structuring process, leading to a structured semiconductor body 102 including a semiconductor base 102b (also referred to as semiconductor base region 102b) and the at least one protrusion 106, for example as shown in FIG. 1B.

The structuring process may include etching (e.g. wet etching or dry etching), for example at least one of photoelectrochemical wet etching in hydrogen fluoride (HF, e.g. 2.5 molar) combined with UV irradiation (which may lead to an isotropic etching), plasma etching using sulfur hexafluoride with oxygen plasma ($SF_6/O_2$ plasma, which gives the possibility to adjust etching characteristics from isotropic to anisotropic), plasma etching using trifluoromethane with oxygen plasma ($CHF_3/O_2$ plasma, which may lead to an anisotropic etching), and plasma etching using tetrafluoromethane with oxygen plasma ($CF_4/O_2$ plasma, which may lead to an anisotropic etching), or etching with potassium hydroxide solution. The material of the masking structure 104 may be chosen to match the etchant to be used, in the sense that the masking structure 104 may essentially resist the etchant, e.g. it may not be removed or may be removed much slower than the carbon-containing semiconductor material of the semiconductor body 102 during the etch process.

In other words, using a structuring process, for example using an etching process, for example using one of the etchants described above, the semiconductor body 102 may be structured, wherein the masking structure 104 may serve as a mask, masking one or more regions of the semiconductor body that are not supposed to be (at least partially) removed during the structuring process. Thereby, the semiconductor body 102 may be formed, e.g. structured, in such a way that it includes at least one protrusion 106 including the carbon-containing semiconductor material. Furthermore, the semiconductor body may include the semiconductor base (or base region) 102b.

After the structuring, the masking structure 104 may in various embodiments be removed, as shown in FIG. 1B. Thereby, the carbon-containing semiconductor material of the semiconductor body 102 may be exposed at the top surface 1021.

Alternatively, the masking structure 104 may remain, for example to prevent a formation of a graphene layer in the masked regions of the semicondutor body 102. In other words, in regions where the masking structure 104 may be left on the carbon-containing semiconductor material of the semiconductor body 102, e.g. on a top of the at least one protrusion 106, the carbon-containing semiconductor material may not be exposed, such that a subsequent annealing process may not lead to a formation of a graphene layer in the masked regions of the semiconductor body 102.

In various embodiments, the at least one protrusion 106 of the semiconductor body 102 may be formed by epitaxial growth of carbon-containing semiconductor material on the semiconductor body 102, which may be regarded as the semiconductor base 102b, e.g. on the first surface 1021, or by a combination of epitaxial growth and removal (e.g. etching) of the carbon-containing semiconductor material. The at least one protrusion 106 formed by epitaxial growth or by a combination of epitaxial growth and removal may be considered as forming a part of the semiconductor body 102.

After a formation of the at least one protrusion 106, a portion of a surface of the semiconductor body 102 from which the at least one protrusion 106 extends (and which may be opposite the second surface 1022 of the semiconductor body 102), i.e. a portion of a surface of the semiconductor base 102b, may be referred to as a first recessed surface 1021r of the semiconductor body 102, irrespective of whether the at least one protrusion 106 was formed by building it on the first surface 1021 of the semiconductor body 102 (e.g. by epitaxial growth), such that the first recessed surface 1021r corresponds to at least a portion of the first surface 1021, or whether the at least one protrusion 106 was formed by removing the semiconductor material around it, thereby newly creating the first recessed surface 1021r.

In various embodiments, the at least one protrusion 106 may be formed in such a way that it extends away from the first recessed surface 1021r of the semiconductor body 102. A first end 1061 of the at least one protrusion 106 may be connected to, e.g. integrally formed with, the semiconductor base 102b of the semiconductor. A second end 1062 of the protrusion 106 may be opposite the first end 1061 of the protrusion 106.

The at least one protrusion 106 may have a length 106L, wherein the length 106L of the at least one protrusion 106 may be measured between the first end 1061 of the protrusion and the second end 1062 of the protrusion 106, for example along a central axis (also referred to as the long axis) of the at least one protrusion 106. The length of the protrusion 106 may correspond to a height of a top, e.g. a top of the second end 1062, of the protrusion 106, above the first recessed surface 1021r. The length 106L of the protrusion 106 may be in a range from about 1 nm to about 1 mm, for example from about 20 nm to about 500 nm, for example from about 50 nm to about 200 nm, although other values of the length may be possible as well.

A width 106W of the at least one protrusion 106 may be measured in a direction essentially orthogonal to the length 106L of the protrusion 106. In FIG. 1B, this may correspond to a horizontal direction. If, in various embodiments, the at least one protrusion 106 may be circularly cylindrical, the width 106W may be the same in all directions in which the width 106W of the at least one protrusion 106 may be measured. In this case, the width 106W may correspond to a diameter of the circularly cylindrical protrusion 106. In various other embodiments, the width of the protrusion 106 may be different for at least some of the (horizontal) directions, in which the width 106W of the at least one protrusion 106 may be measured, for example in a case where a cross section of the at least one protrusion 106 is rectangular, elliptical, or of some other polygonal or irregular shape. In that case, if relevant, several values may be specified for the width 106W of the protrusion 106, e.g. a minimum and a maximum width, etc.

In various embodiments, the width 106W of the at least one protrusion 106 may be essentially constant along the length 106L of the protrusion 106. Alternatively, the width 106W of the at least one protrusion 106 may vary along the length 106L of the protrusion. For example, the at least one protrusion 106 may have a larger width 106W near the first end 1061 of the protrusion 106 than near the second end 1062 of the protrusion 106, or vice versa.

In various embodiments, the width 106W of the at least one protrusion 106 may be greater than or equal to about 0.4 nm, for example in a range from about 0.4 nm (which may correspond to a minimum diameter of a carbon nanotube) to about 200 nm, for example from about 1 nm to about 20 nm, for example from about 5 nm to about 10 nm.

In various embodiments, the at least one protrusion 106 may have a cylindrical shape. In other words, an outer peripheral surface 106o of the protrusion 106 may be cylindrical. The cross section of the at least one protrusion 106 may have an outline that is of any other regular or irregular closed shape, e.g. a circle, an ellipse, a polygon (e.g. a square, a rectangle, a hexagon, a trapezium or the like), a half-moon shape, etc. An exemplary cross section along a line A-A' of a circularly cylindrical protrusion 106 (i.e. the cross section shows the outer peripheral surface 106o being circular) is shown in view 100A of FIG. 1B. In various embodiments, the cylinder may be a straight cylinder. In other words, the at least one cylindrical protrusion 106 may be arranged such that its long axis is essentially orthogonal to the first recessed surface 1021r and/or to the second surface 1022 of the semiconductor body 102. In various other embodiments, the at least one protrusion 106 may be arranged such that its long axis is inclined with respect to the first recessed surface 1021r and/or to the second surface 1022 of the semiconductor body 102.

In various embodiments, the protrusion 106 may have any other regular or irregular shape, for example a pyramid, a cone, a frustum, or a randomly shaped protrusion 106.

In various embodiments, a crystal structure of the carbon-containing semiconductor material may be taken into account for the forming of the at least one protrusion 106 in order to form a desired surface configuration of the outer surface 106o of the at least one protrusion 106. For example, the semiconductor body 102 with the at least one protrusion 106 may be formed in such a way that a pre-defined portion of the outer surface 106o of the protrusion 106 coincides with a pre-defined crystal plane of the carbon-containing semiconductor material. Thereby, for example, a termination of the semiconductor material at the pre-defined portion of the outer surface 106o of the protrusion 106 may be defined. In a case of a silicon carbide semiconductor material, a crystal cut along a (0001) plane of the silicon carbide may lead to two differently terminated surfaces, also referred to as faces: on one side of the cut, a carbon-terminated surface (also referred to as C-face) may form, while on another side of the cut, a silicon-terminated surface (also referred to as Si-face) may form. The surface termination along the outer surface 106o of the at least one protrusion 106 may have an impact on properties of a graphene layer to be formed, as described below.

In order to take into account the crystal structure of the carbon-containing semiconductor material, a relative orientation of the semiconductor body 102 and the at least one protrusion 106 to be formed may be chosen such that the pre-defined portion of the outer surface 106o of the protrusion 106 may coincide with a pre-defined face of a cut through the crystal of the semiconductor material, for example along the pre-defined crystal plane. For example, the at least one protrusion 106 may have a rectangular cuboid shape, in other words, the outer surface 106o of the protrusion may 106 have two pairs of opposite equal faces that are at right angles to each other, the carbon-containing semiconductor material may be silicon carbide, and the relative orientation of the silicon carbide and the at least one protrusion 106 may be such that one of the faces of the outer surface 106o of the protrusion 106 may be a C-face, and the opposite face of the protrusion 106 may be an Si-face, for example a plane of the C-face and/or of the Si-face may be essentially or exactly parallel to the (0001) plane of the silicon carbide. In various other embodiments, other shapes of the at least one protrusion 106, other relative orientation and/or other semiconductor material may be used for obtaining a desired surface configuration of the outer surface 106o of the at least one protrusion 106.

In various embodiments, like in the exemplary embodiment of the rectangular cuboid protrusion 106 with the C-face and the Si-face, the surface configuration of the outer surface 106o of the at least one protrusion 106 may vary along an azimuthal direction of the outer surface 106o of the protrusion. For example, in a first azimuthal direction of the at least one protrusion 106, a first surface configuration (for example a C-face) may be encountered on the outer surface 106o, in a second azimuthal direction of the at least one protrusion 106, a second surface configuration (for example an Si-face, for example if the two azimuthal directions differ by about 180°) may be encountered, and one or more further surface configurations (for example a mixed face, with silicon and carbon alternating) may be encountered in one or more further azimuthal directions.

In a case where a plurality of protrusions 106 is formed, the plurality of protrusions 106 may in various embodiments be essentially identical to each other, i.e. each of the protrusions 106 may have essentially the same length, essentially the same width, and essentially the same shape. Furthermore, a basic arrangement of the plurality of protrusions 106 may be the same, e.g. they may all be arranged with their long axes pointing in the same direction, and/or in a case where the width 106W varies along the length 106L of the protrusions 106, all the protrusions 106 may be arranged with the wider end at the same position, e.g. with the wider end being connected to the semiconductor base 102b and the narrower end pointing away from the semiconductor base 102b, or vice versa.

In various embodiments, properties of the individual protrusions 106 of the plurality of protrusions 106 and/or their arrangement on the semiconductor base 102b may vary, e.g. be inhomogeneous. For example, the length 106L, the width 106W, and/or the shape of the individual protrusions 106 may be different. Furthermore, the long axes of the individual protrusions 106 may point to different directions.

In various embodiments, the plurality of protrusions 106 may be arranged, for example on the semiconductor base 102b of the semiconductor body 102, with a separation 106S between each adjacent pair of protrusions 106. The separation 106S may refer to a distance between the outer surfaces 106o of two adjacent protrusions 106.

In various embodiments, the separation 106S between each pair of adjacent protrusions 106 may be greater than or equal to about 1 nm, for example in a range from about 1 nm to about 1 cm, e.g. between about 5 nm and about 1 μm.

In various embodiments, the plurality of protrusions 106 may be arranged to form a regular pattern. In other words, the plurality of protrusions 106 may be arranged having a recurrent structure (e.g. distribution of positions of the protrusions 106 and/or of the separations 106S between them). For example, the protrusions 106 may be arranged forming a regular grid, for example, in a case where the plurality of protrusions 106 may be formed from a semiconductor wafer 102, the plurality of protrusions 106 may be arranged such that one or more of the protrusions 106 are formed in an essentially identical fashion on each of a plurality of chips to be formed from the semiconductor wafer 102.

In various embodiments, the plurality of protrusions may be arranged irregularly or only partially structured. For example, the positions of the protrusions 106, e.g. on the semiconductor base 102b, and/or the separations 106S between the protrusions 106, may vary irregularly, e.g. randomly.

Describing the process shown in FIG. 1A and FIG. 1B in other words, various embodiments of a method of forming a graphene structure may include forming at least one semiconductor structure 106 having a cylindrical surface 106*o*, the at least one semiconductor structure 106 projecting from at least one surface 1021*r* of a semiconductor substrate 102 and including carbon-containing semiconductor material.

In various embodiments, as shown in FIG. 1C, a graphene layer 108 may be formed at least at a peripheral portion of the outer surface 106*o* of the at least one protrusion 106. In other words, a process of forming a graphene layer 108 at an outer peripheral surface of the at least one protrusion 106 may be executed. An outer surface of the graphene layer 108 may be uncovered.

The process of forming the graphene layer 108 may, in various embodiments, include an annealing process. The semiconductor body 102 may be heated to an elevated temperature, which may also be referred to as an annealing temperature. The elevated temperature may be in a range from about 1150° C. to about 1800° C. In various embodiments, the elevated temperature during the forming of the graphene layer may be in a range from about 1150° C. to about 1400° C., for example from about 1150° C. to about 1350° C., for example from about 1200° C. to about 1300° C., e.g. if the forming of the graphene layer is executed in vacuum, e.g. at a pressure at about $10^{-8}$ mbar or lower, e.g. in ultra-high vacuum. In various embodiments, the elevated temperature during the forming of the graphene layer may be in a range from about 1550° C. to about 1800° C., for example from about 1600° C. to about 1700° C., for example about 1650° C., e.g. if the forming of the graphene layer 108 is executed at approximately atmospheric pressure, e.g. at a pressure from about 800 mbar to about 1000 mbar, e.g. about 900 mbar, for example in an atmosphere including, consisting of or essentially consisting of argon.

The semiconductor body 102 may be kept at the elevated temperature for a time referred to as the heating duration or as the annealing duration, respectively. The heating duration may, in various embodiments, be in a range from about 5 minutes to about 60 minutes, for example from about 10 minutes to about 30 minutes, for example about 15 minutes.

In various embodiments, a subsequent annealing process of heating the semiconductor body 102 to a temperature in a range from about 600° C. to about 1000° C., for example in an atmosphere including, consisting of or essentially consisting of hydrogen, may decouple a semiconductor body—graphene interaction for example by saturating dangling bonds at a resulting surface of SiC forming underneath the graphene layer 108. In various embodiments, different intercalation materials may be used, e.g. Ge, Si, which may be advantageous for a subsequent etching process.

The at least one graphene layer 108 may be formed by thermal decomposition of the carbon-containing semiconductor material of the semiconductor body 102, e.g. silicon carbide, at a surface, e.g. an exposed surface, of the semiconductor body 102. In other words, in one or more regions where the carbon-containing semiconductor material of the semiconductor body 102 may be exposed, e.g. exposed to vacuum or to an atmosphere, during the annealing process, the at least one graphene layer 108 may form by thermal decomposition of the carbon-containing semiconductor material. During the annealing process, atoms of the carbon-containing semiconductor material except the carbon, e.g. silicon atoms of silicon carbide, may sublime if the carbon-containing semiconductor material is exposed to vacuum or to an atmosphere, leaving behind excess carbon at the surface of the carbon-containing semiconductor material. The excess carbon may bond to form graphene, e.g. at least one graphene layer. The exposed surface formed by the carbon-containing material of the semiconductor body 102 may at least include the peripheral surface of the at least one protrusion 106 of the semiconductor body 102. In other words, the at least one graphene layer 108 may at least form at or on the peripheral surface of the at least one protrusion 106. In various embodiments, other portions of the surface of the semiconductor body 102 may be formed from the carbon-containing semiconductor material and may be exposed, such that the at least one graphene layer 108 may also form in said portions of the surface of the semiconductor body 102, e.g. during the annealing process.

In the exemplary embodiment shown in FIG. 1C, the at least one graphene layer 108 is also formed at or on the first recessed surface 1021*r* and on a top surface, i.e. the surface at the second end 1062, of the at least one protrusion 106. A formation of the at least one graphene layer 108 at or on the second surface 1022 of the semiconductor body 102 and at or on the surface connecting the second surface 1022 with the first recessed surface 1021*r* may be avoided by preventing an exposure of those surfaces, e.g. by covering those surfaces with a protecting layer and/or with a mechanical cover, e.g. a holding structure or a lid, in some embodiments.

In general, in various embodiments, portions of the surface of the semiconductor body 102 at which, in addition to the outer peripheral surface 106*o* of the at least one protrusion 106, a forming of the at least one graphene layer 108 may be desired may be formed from a carbon-containing semiconductor material and may be left exposed. Forming (and leaving in place) the graphene layer 108, completely or at least partially, e.g. locally, also at portions of the surface of the semiconductor body 102 other than the outer peripheral surface 106*o* (as for example shown in FIG. 1C and FIG. 1D) may for example be desired for forming an electrically conductive connection between a plurality of graphene layers 108, e.g. graphene structures 108*s*, formed in different regions of the semiconductor body 102. The plurality of graphene layers 108, for example a plurality of carbon nanotubes 108*c*, may be electrically connected by the portion of the graphene layer 108 formed at or on the surface of the semiconductor body 102 between the carbon nanotubes 108*c*, for example at or on the first recessed surface 1021*r*, which may correspond to a bottom of a trench formed in the semiconductor body 102 for forming the plurality of protrusions 106, or at or on a dedicated additional structure, for example a connecting wall (not shown), e.g. a thin, vertical plate-like structure, formed between the plurality of protrusions 106.

Portions of the surface of the semiconductor body 102 at which a forming of the at least one graphene layer may not be desired may be covered, e.g. by a protective layer, a mechanical cover or the like, or they may be formed from a material other than a carbon-containing semiconductor material.

In various embodiments, the at least one graphene layer 108 may be formed by epitaxially growing, e.g. depositing, the at least one graphene layer at least on the outer peripheral surface 106*o* of the at least one protrusion 106. In various embodiments, portions of the surface of the semiconductor body 102 at which, in addition to the outer peripheral surface 106*o* of the at least one protrusion 106, a forming of the at least one graphene layer may be desired, may be formed from a carbon-containing semiconductor material and may be left exposed. Portions of the surface of the semiconductor body 102 at which a forming of the at least one graphene layer by deposition may not be desired may be treated in such a way that either carbon is not deposited there for the formation of the at least one graphene layer 108, or that the deposited carbon, which may or may not have formed graphene, may easily be removed, e.g. together with a protective layer formed in that region.

In various embodiments, the at least one graphene layer 108 may include a single atomic layer of graphene, also referred to as a single graphene layer or graphene monolayer. Alternatively, the at least one graphene layer 108 may include a graphene layer 108 having a thickness of more than one atom, also referred to as graphene multilayer. For example, the graphene layer 108 may be a 2-atoms thick layer, a 3-atoms thick layer, etc., up to approximately a 10-atoms thick layer.

In various embodiments, a pre-defined termination of the carbon-containing semiconductor material, e.g., silicon carbide, at least on the peripheral outer surface of the at least one protrusion 106, e.g. as described above, e.g. the C-face, the Si-face and/or a mixed face, may be used for pre-defining the thickness of the at least one graphene layer 108. For example, on the C-face a thicker graphene layer 108 may form than on the Si-face under the same processing conditions. For example, a 2-atoms thick layer may form on the C-face, wherein a 1-atom-thick layer may form on the Si-face.

In other words, a deliberately selected termination of the peripheral outer surface 106o of the at least one protrusion 106 may represent a parameter of one or more parameters that may be adjusted in the method of forming a graphene structure for obtaining the graphene structure 108s with desired properties.

In various embodiments, by creating the at least one graphene layer 108 with a pre-defined thickness, for example by adjusting the properties of the carbon-containing semiconductor material and/or of process parameters of the process or processes carried out for the forming of the at least one graphene layer 108, properties of the at least one graphene layer 108, e.g. a band gap and/or an electrical conductivity, of the at least one graphene layer 108 may be adjusted. In various embodiments, e.g. in an example where the graphene layer 108 may form graphene nanoribbons (e.g., having a width of less than or equal to about 100 nm), in an example where the graphene layer 108 may be bent, or in an example where the graphene layer 108 may be a 2-atoms thick layer, or, more generally, thicker than a monolayer, a band gap may form.

In various embodiments, the process parameters that may be adjusted for adjusting the properties of the graphene layer 108 may include the annealing temperature. For example, annealing the semiconductor body 102 at a comparatively high temperature, e.g. with a temperature in a range from about 1550° C. to about 1800° C., for example from about 1600° C. to about 1700° C., for example about 1650° C., may lead to a formation of predominantly or exclusively graphene monolayers. In that case, the annealing may be executed at approximately atmospheric pressure, e.g. at a pressure from about 800 mbar to about 1000 mbar, e.g. about 900 mbar, for example in an atmosphere including, consisting of or essentially consisting of argon. For example, annealing the semiconductor body 102 at a comparatively low temperature, e.g. with a temperature in a range from about 1150° C. to about 1400° C., for example from about 1150° C. to about 1350° C., for example from about 1200° C. to about 1300° C., may lead to a formation of predominantly graphene multilayers. In that case, the annealing may be executed in vacuum, e.g. at a pressure at about $10^{-8}$ mbar or lower, e.g. in ultra-high vacuum. Varying the annealing temperature within the given range may allow adjusting the number of atomic layers the graphene layer 108 may include. Annealing the semiconductor body 102 at an annealing temperature in a range from about 1150° C. to about 1250° C. may for example result in a graphene layer 108 with fewer atomic layers than annealing the semiconductor body 102 at an annealing temperature in a range from about 1250° C. to about 1400° C.

The semiconductor body 102 may be kept at the elevated temperature for a time referred to as the heating duration or annealing duration. The heating duration may, in various embodiments, be in a range from about 5 minutes to about 60 minutes, for example from about 10 minutes to about 30 minutes, for example about 15 minutes.

In various embodiments, the process parameters that may be adjusted for adjusting the properties of the graphene layer 108 may include the annealing duration. For example, annealing the semiconductor body 102 for a comparatively long time, e.g. with an annealing duration in a range from about 30 minutes to about 60 minutes may lead to a thicker graphene layer 108, e.g. to a graphene multilayer, e.g. a graphene multilayer with more atomic layers than achieved with a shorter annealing duration, for example in a range from about 5 minutes to about 30 minutes.

In various embodiments, the thickness of the at least one graphene layer 108 formed at or on the outer peripheral surface 106o of the at least one protrusion 106 may vary for different portions of the graphene layer 108. For example, a first portion of the at least one graphene layer 108 formed in a first azimuthal direction of the at least one protrusion 106 or on a first face of the at least one protrusion 106 may have a different thickness than a second portion of the at least one graphene layer 108 formed in a second azimuthal direction of the at least one protrusion 106 or on a second face of the at least one protrusion 106. For example, on an Si-face of the at least one protrusion 106, a single graphene layer 108 may form, whereas on an opposite C-face of the at least one protrusion 106, a graphene multilayer 108 may form. The at least one graphene layer 108 may, in various embodiments, thus be considered as being faceted.

In various embodiments, a faceting of the at least one graphene layer 108 may, alternatively or additionally, concern other properties of the at least one graphene layer 108, e.g. an electrical and/or thermal conductivity and/or a structure in which the carbon atoms of the at least one graphene layer are bonded. For example, the carbon atoms may, in a first azimuthal direction of the at least one protrusion 106, be bonded in a way that may resemble a so-called armchair configuration of a carbon nanotube, and may, in a second azimuthal direction, be bonded in a way that may resemble a so-called zigzag- or a so-called chiral configuration of a carbon nanotube.

In various embodiments, the at least one graphene layer 108 may form a three-dimensional graphene structure 108s. A shape, e.g. a three-dimensional shape of the at least one graphene layer 108, e.g. a width, length and a way in which the two-dimensional graphene layer 108 may be arranged, e.g. bent and/or linked, in a third dimension, may be pre-defined by the outer peripheral surface 106o of the at least one protrusion 106. In other words, since the at least one graphene layer 108 may be formed at the outer peripheral surface 106o of the at least one protrusion 106, e.g. using carbon atoms provided by the carbon-containing semiconductor material forming the at least one protrusion 106 (and thus the outer peripheral surface 106o of the at least one protrusion 106) or by being deposited on the outer peripheral surface 106o of the at least one protrusion 106, the graphene layer 108 may assume the shape pre-defined by the outer peripheral surface 106o of the at least one protrusion 106. The length of the graphene structure 108s, e.g. a carbon nanotube 108c, which may be measured in the same direction as the length 106L of the at least one protrusion 106, may be defined by the length 106L of the at least one protrusion 106, for example by a height of pillars, mesa-like structures, circular cylinders or the like above the first recessed surface 1021r. A width, e.g. a diameter, e.g. an inner diameter, of the graphene structure 108s may be defined by the width 106W, e.g. the diameter d, e.g. an outer diameter d, of the at least one protrusion 106, e.g. the pillars, mesa-like structures, circular cylinders or the like.

In various embodiments, the annealing of the semiconductor body 102, e.g. of a semiconductor substrate 102, may lead to a forming of graphene at the outer surface, e.g. the outer peripheral surface 106o, e.g. the cylindrical surface, of the at least one protrusion 106, e.g. a semiconductor structure, e.g. a semiconductor structure formed from carbon-containing semiconductor material, thereby forming at least one cylindrical graphene structure 108s.

In various embodiments, for example in a case where the outer peripheral surface 106o of the at least one protrusion 106 may be cylindrical, e.g. circularly cylindrical or polygonal, the at least one graphene layer 108 may form at least one carbon nanotube 108c.

In various embodiments, the at least one protrusion 106 may be formed with a shape and/or a dimension (e.g. a width) that may be suitable for forming the at least one graphene layer 108 with a desired property. For example, in a case of a circularly cylindrical protrusion 106 with a width 106W corresponding to a diameter d of the circularly cylindrical protrusion 106, the diameter d of the protrusion may be chosen to fulfill the relation $d=78.3\times((n+m)^2-n\times m)^{0.5}$ pm for a combination of integer values of m and n that may not both be zero. The diameter of the, e.g. three-dimensionally shaped graphene layer 108, may correspond to the diameter d of the at least one protrusion 106. In a case where m=n, the graphene layer 108 may form a carbon nanotube 108c with an armchair configuration. In a case where n is an integer and m is zero, a carbon nanotube 108c with a zigzag configuration may be formed, and for other combinations of m and n, a carbon nanotube 108c with a chiral configuration may be formed. An electrical conductivity of the carbon nanotube may vary with its diameter d. The electrical conductivity may for example vary between a metallic behavior and a semiconducting behavior. For example, a band gap of the nanotube may vary from zero eV (corresponding to metallic behavior) up to a few eV, e.g. 2 eV (semiconducting behavior), depending on the diameter d and chirality.

In various embodiments, other properties (than the diameter) of the at least one protrusion 106 may be adjusted, for example as described above, for obtaining a desired surface configuration of the peripheral outer surface 106o of the at least one protrusion 106. The adjustment of the properties may allow for the forming of the at least one graphene layer 108 with specific properties. In various embodiments, arranging the crystal, e.g. the SiC substrate, to have a specific orientation may allow for a forming of the at least one graphene layer 108, e.g. the carbon nanotube 108c, with a specific configuration (e.g., armchair, zigzag or chiral). In various embodiments, the shape of the at least one protrusion 106, e.g. may be adjusted for obtaining a desired property in the at least one graphene layer 108 formed at or on the outer peripheral surface of the at least one protrusion 106. For example, the peripheral outer surface 106o of the at least one protrusion 106 may have a polygonal shape (e.g. a polygonal cross-section). In various embodiments, an angle between two faces of the polygon having a common edge (also referred to as the binding angle) may be varied. Thereby, a variation, e.g. a local variation, of the band gap of the at least one graphene layer 108 formed on the outer peripheral surface 106o of the at least one protrusion 106 may be possible. For example, decreasing the binding angle may make the band gap (e.g. of the at least one graphene layer 108) larger. The at least one graphene layer 108 may be a single-walled or a multi-walled graphene layer 108.

In various embodiments, some or all of the above described parameters (e.g., termination (e.g. Si-face or C-face) of the surface of the carbon-containing semiconductor material, e.g. of the substrate 102, epitaxy parameters, e.g. parameters of the annealing process, e.g. parameters used for the epitaxial formation of the graphene layer 108), and possibly other parameters, may be adjusted, for example as described above, for forming the at least one graphene layer 108 with the desired properties, e.g. single- or multi-wall graphene layer, e.g. single- or multiwall carbon nanotubes, specific band gaps, etc.

In various embodiments, as shown in FIG. 1D, the carbon-containing semiconductor material of the at least one protrusion 106 may be removed from an inside 110 of the at least one graphene layer 108, e.g. from an inside 110 of the at least one graphene structure 108s. In other words, the method of forming a graphene structure 108s may further include removing a portion of the protrusion 106 that may reside within the graphene layer 108, e.g. the graphene structure 108s. In various embodiments, the removing the portion of the protrusion may include etching, for example using etching processes as described above for the structuring of the semiconductor body 102. In an exemplary case where the graphene layer 108 may have been formed also on the top of the protrusion 106, that top portion of the graphene layer 108 may be removed before the removal of the carbon-containing semiconductor material from the inside 110 of the at least one graphene layer 108. The removing of the top portion of the graphene layer 108 may include chemical mechanical polishing and/or any other known means.

In various embodiments, portions of the at least one graphene layer 108 may be removed from regions where the graphene layer 108 may not be desired. As for example shown in FIG. 1E, a portion of the graphene layer 108 formed on the first recessed surface 1021r of the semiconductor body 102 may be removed, for example by etching.

In various embodiments, as described above and shown in FIG. 1A to FIG. 1E, a graphene structure 108s may be formed. A graphene structure arrangement may include a semiconductor substrate 102, e.g. a base 102b of the semiconductor substrate 102, and the graphene structure 108s, e.g. at least one cylindrical graphene structure 108s. A first end 108b of the cylindrical graphene structure 108s may be attached to the semiconductor substrate 102, e.g. to the base 102b of the semiconductor substrate 102. An outside of the cylindrical graphene structure 108s may be free from material of the semiconductor substrate 102.

In various embodiments, an inside of the cylindrical graphene structure 108s may be free from material, e.g. free from material of the semiconductor substrate. Alternatively, an inside of the cylindrical graphene structure 108s may be filled with a semiconductor material containing carbon. The semiconductor material filling the cylindrical graphene structure 108s may be the same as the semiconductor material of the semiconductor substrate 102.

FIGS. 2A and 2B show two stages of a method of forming a graphene structure according to various embodiments.

Various components, materials, processes, parameters etc. applying to various embodiments shown in FIG. 2A and FIG. 2B may be similar or identical to those described above. Their description may not be repeated here.

In various embodiments, as shown in FIG. 2A, an opening 110 may be formed in the at least one protrusion 106 of the semiconductor body 102. Thereby, a hollow protrusion 106, e.g. a hollow cylinder 106, may be formed. The hollow protrusion 106 may have an outer peripheral surface 106o shaped according to any of the various embodiments described above. An inner peripheral surface 106i of the hollow protrusion 106 may have any shape. In various embodiments, the inner peripheral surface 106i may essentially trace the outer peripheral surface 106o, thereby forming a hollow protrusion 106, e.g. a hollow cylinder 106, with an essentially uniform wall thickness.

In various embodiments, the forming of the graphene structure 108s may further include an annealing of the semiconductor body 102. During the annealing, the inner peripheral surface 106i may, in addition to at least the outer peripheral surface 106o, be exposed. At least one graphene layer 108 may thus be formed at least on the outer peripheral surface 106o and on the inner peripheral surface 106i.

Figure 3A:
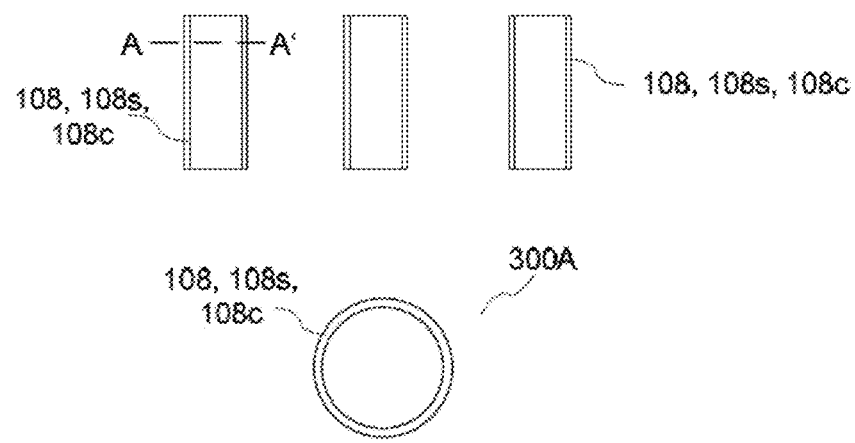
FIGS. 3A and 3B show graphene structures in accordance with various embodiments.
Figure 3B:
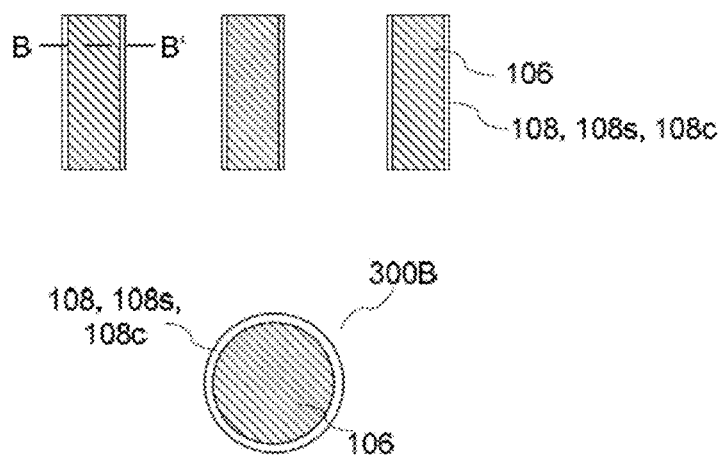

FIGS. 3A and 3B show graphene structures 108s in accordance with various embodiments.

Processes described above may have been employed for forming the at least one graphene layer 108, e.g. the at least one graphene structure 108s, shown in each of FIG. 3A and FIG. 3B.

Furthermore, the at least one graphene layer 108, e.g. the at least one, e.g. three-dimensional, graphene structure 108s, may be removed from the semiconductor base 102b of the semiconductor body 102. In other words, the method of forming a graphene structure may, in various embodiments, further include detaching the at least one graphene structure 108s, and possibly also the at least one protrusion 106, from a remaining portion, e.g. the base 102b, of the semiconductor body, thereby forming at least one detached cylindrical graphene structure, which may or may not be filled with the carbon-containing semiconductor material. In other words, at least one detached graphene layer 108, e.g. a plurality of detached graphene layers 108, e.g. of individual detached graphene layers 108, e.g. of detached graphene structures 108s, e.g. of individual detached graphene structures 108s, may be formed. Each of the individual detached graphene layers 108, e.g. of the individual detached graphene structures 108s, may include a graphene monolayer or a graphene multilayer. The plurality of graphene layers/structures 108, 108s may essentially all have the same length. An inside of the at least one graphene layer/structure 108, 108s may be free or partially free from the carbon-containing semiconductor material. Alternatively, the at least one graphene layer/structure 108, 108s may be filled, e.g. completely or essentially completely, with the carbon-containing semiconductor material, e.g. the carbon-containing semiconductor material that was used for forming the at least one graphene layer 108.

In an exemplary case where the individual graphene layer/structure 108, 108s includes a graphene multilayer, the individual graphene layer/structure 108, 108s may include a plurality of graphene layers that may be arranged concentrically, i.e. one graphene layer/structure inside another graphene layer/structure.

In various embodiments, the at least one graphene layer/structure 108, 108s may include at least one carbon nanotube 108c, for example as described above.

In various embodiments, the at least one graphene layer/structure 108, 108s may include at least one carbon nanotube 108c that may be filled with carbon-containing semiconductor material, e.g. SiC, for example as described above. A carbon nanotube in accordance with various embodiments may be filled with silicon carbide.

In various embodiments, the at least one graphene layer/structure 108, 108s, e.g. the at least one carbon nanotube 108c, may be removed from the semiconductor base 102b of the semiconductor body 102 by etching. In the exemplary embodiment shown in FIG. 3A, with an inside of the at least one graphene layer/structure 108, 108s being free from the carbon-containing semiconductor material, a removal of the carbon-containing semiconductor material may for example be carried out as described in context with FIG. 1D for removing the carbon-containing semiconductor material from an inside of the at least one graphene layer 108 on a semiconductor body 102 with a graphene layer 108 formed on a peripheral outer surface 106o of at least one protrusion 106 of the semiconductor body 102 as for example shown in FIG. 1E. The etching may be continued until the carbon-containing semiconductor material is not only removed from the inside of the graphene structure 108s, but also fails to provide a connection to the base 102b of the semiconductor body 102, thereby releasing the at least one graphene layer/structure 108, 108s. An outer surface of the carbon nanotube may be uncovered. View 300A of FIG. 3A shows a cross section along the line A-A' of FIG. 3A for an example of an unfilled circularly cylindrical graphene layer/structure/carbon nanotube 108, 108s, 108c, hence the graphene layer/structure/carbon nanotube 108, 108s, 108c is shown as an unfilled circle.

In the exemplary embodiment shown in FIG. 3B, with an inside of the at least one graphene layer/structure 108 being filled with the carbon-containing semiconductor material, a removal of the carbon-containing semiconductor material may for example be executed by annealing the semiconductor body 102 in a hydrogen atmosphere. In other words, the at least one graphene layer/structure 108, 108s filled with the carbon-containing semiconductor material, e.g. a carbon nanotube 108c filled with the carbon-containing semiconductor material, e.g. with silicon carbide, may be decoupled from the semiconductor body 102, e.g. from a silicon carbide substrate, by annealing in a hydrogen atmosphere. An outer surface of the carbon nanotube may be uncovered. View 300B of FIG. 3B shows a cross section along the line B-B' of FIG. 3B for an example of a filled circularly cylindrical graphene layer/structure/carbon nanotube 108, 108s, 108c, hence the graphene layer/structure/carbon nanotube 108, 108s, 108c is shown as a circle filled with the carbon-containing semiconductor material of the at least one protrusion 106.

FIGS. 4A to 4F show various stages of a method of forming a transistor in accordance with various embodiments.

In various embodiments, at least one graphene layer 108, e.g. a graphene layer 108 according to an embodiment described above, may form part of a transistor, e.g. of a field effect transistor, e.g. a vertical field effect transistor. The method of forming a graphene structure 108s, e.g. a carbon nanotube, as described above may make a defined forming of a field effect transistor with a vertical architecture possible.

A method of forming a transistor may include forming a graphene structure 108s, for example as described above.

The method of forming a transistor may, in various embodiments, include forming a semiconductor body 102 including at least one protrusion 106 including carbon-containing semiconductor material, and forming a graphene layer 108 at an outer peripheral surface of the at least one protrusion 106. The method of forming a transistor may, in various embodiments, include forming at least one protrusion 106 with a cylindrical, e.g. outer peripheral, surface, the protrusion 106 projecting from a first side 102l of a semiconductor body 102, wherein the at least one protrusion 106 may be formed from a carbon-containing semiconductor material, and thereafter annealing the semiconductor body 102 such that graphene may form on the at least one cylindrical surface, thereby forming at least one cylindrical graphene structure 108s.

Figure 4A:
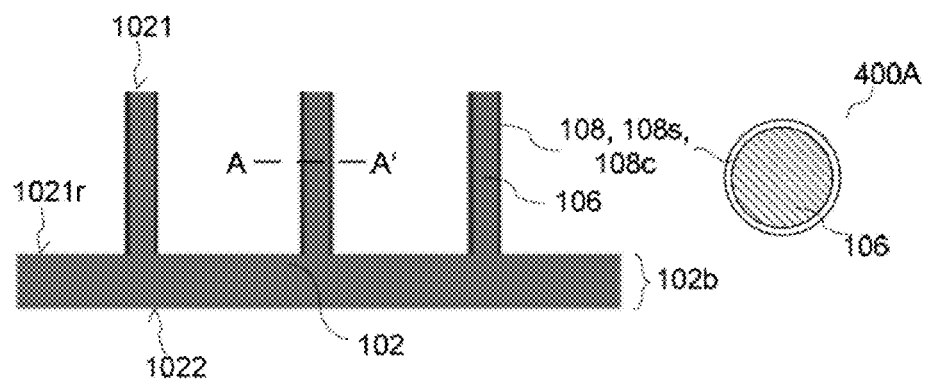
FIGS. 4A to 4F show various stages of a method of forming a transistor in accordance with various embodiments.

In FIG. 4A, the transistor is shown at an intermediate stage after the forming of the graphene layer 108. The transistor at this intermediate stage may differ from the configuration of FIG. 1C in that the graphene layer 108 in FIG. 4A may not be formed at or may have been removed from a top of the at least one protrusion 106 and from the first recessed surface 102lr of the semiconductor body 102. The removal of portions of the graphene layer from the first recessed surface 102lr, which may lead to the graphene layers 108 formed on, e.g. a plurality of, the at least one protrusion 106 being electrically insulated from each other (or at least, not being electrically connected), e.g. by etching, may for example be carried out by a spacer etching process (which more generally may refer to an etching process that creates a spacer at a side wall of some other element). View 400A shows a cross section along line A-A' of FIG. 4A.

Figure 4B:
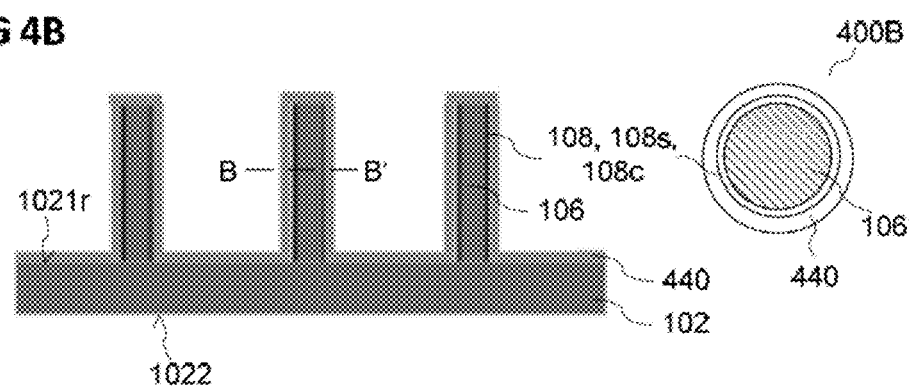

As shown in FIG. 4B, the method of forming a transistor may, in various embodiments, further include forming a dielectric layer 440 on an outside of the at least one graphene layer/structure 108, 108s, e.g. on an outside of a cylindrical graphene layer/structure 108, 108s. The dielectric layer 440 may further be formed on the first recessed surface 102lr and/or on a top of the at least one protrusion 106. The dielectric layer 440 may be formed using known techniques and materials for forming a gate dielectric, for example atomic layer deposition or the like, for example for depositing an oxide. View 400B shows a cross section along line B-B' of FIG. 4B.

Figure 4C:
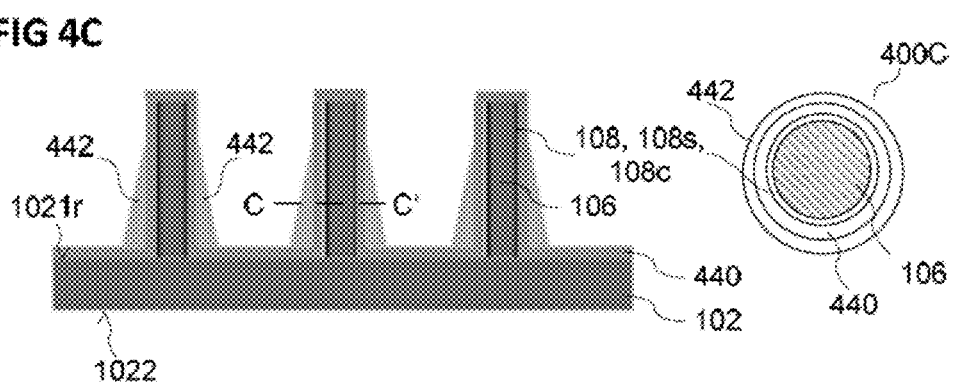

As shown in FIG. 4C, the method of forming a transistor may, in various embodiments, further include forming a gate 442 around an outside of the gate dielectric 440 formed around the at least one graphene layer 108, e.g. the cylindrical graphene structure 108s. The gate 442 may be electrically insulated from the at least one graphene layer 108, e.g. the cylindrical graphene structure 108s. The electrical insulation may be provided by the gate dielectric 440. The forming the gate 442 may include depositing an electrically conductive material, e.g. polysilicon, a metal or metal alloy, or any other suitable electrically conductive material, at least around an outside of the gate dielectric 440. In various embodiments, the material for forming the gate 442 may be deposited on the first side of the semiconductor body 102, e.g. above the first recessed surface 102lr of the semiconductor body 102. The material for forming the gate 442 may be deposited as a layer. The gate 442 (which may include a plurality of gates 442, e.g. one gate for each of a plurality of graphene layers/structures 108, as shown in FIG. 4C) may be formed by etching those portions of the layer that may not form part of the gate 442. As for example shown in FIG. 4C, the gate 442 may have a shape of a cone-shaped annulus around the at least one graphene layer/structure 108, 108s. The etching of the gate 442 may for example be carried out by a spacer etch process.

An intermediate structure of the transistor formed by the processes up to now may be an essentially free-standing structure, as shown in FIG. 4C. View 400C shows a cross section along line C-C' of FIG. 4C.

Figure 4D:
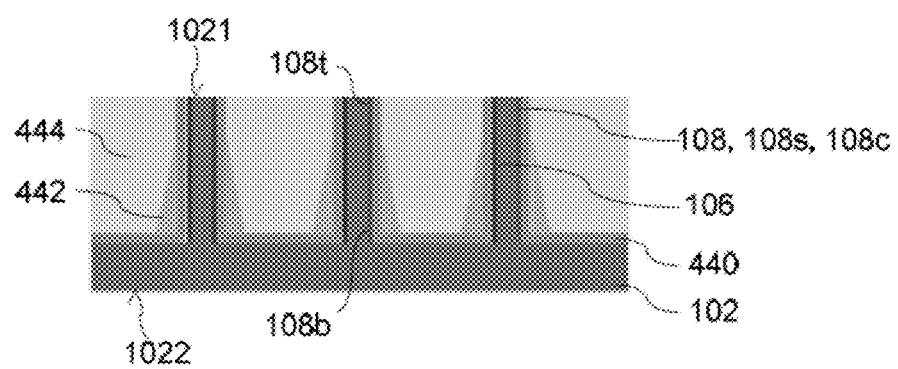

As shown in FIG. 4D, the, e.g. free-standing, structure may be stabilized by forming a stabilizer 444 around the structure, thereby mechanically stabilizing the structure. The stabilizer 444 may for example include or be a dielectric material or layer. The stabilizer 444 may for example be formed by chemical vapor deposition. The forming of the stabilizer 444 may enable conducting a subsequent process. Using for example a chemical mechanical polishing process, a portion of the gate dielectric 440 that may have been formed on a top of the at least one protrusion 106 may be removed. Thereby, access may be provided to the carbon-containing semiconductor material within the at least one graphene layer/structure 108, as shown in FIG. 4D.

Figure 4E:
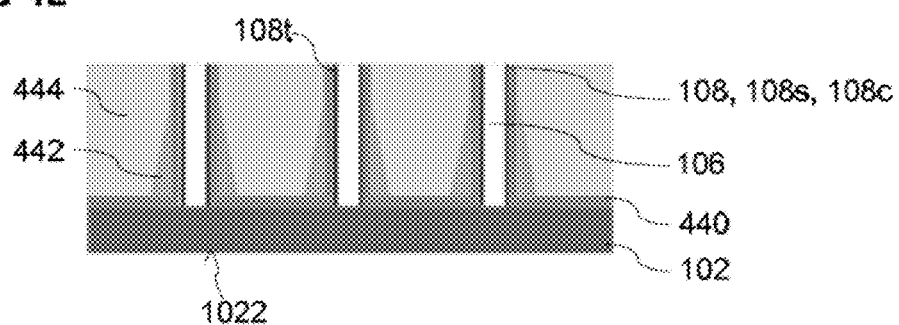

As shown in FIG. 4E, the carbon-containing semiconductor material, e.g. the silicon carbide, e.g. a silicon carbide core, may be removed from within the at least one graphene layer/structure 108, 108s, for example by etching, for example as described above.

Figure 4F:
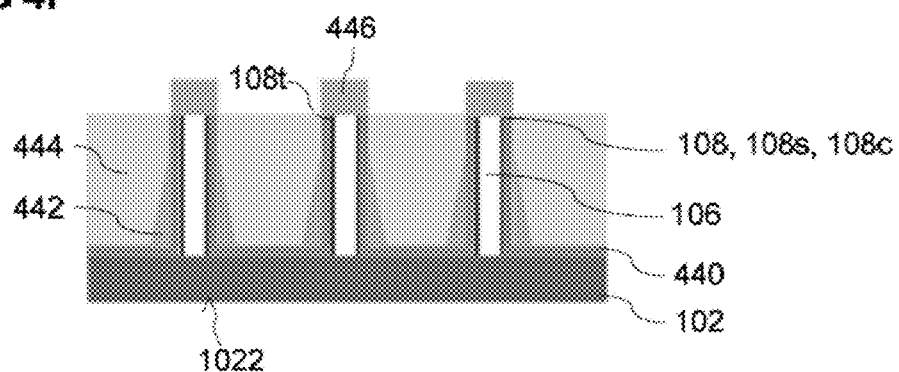

As shown in FIG. 4F, at least one electrode 446, e.g. including or consisting of an electrically conductive material, may be formed, e.g. by known means, e.g. by deposition and etching, on the at least one graphene layer/structure 108, 108s, e.g. on a top surface at the top end 108t of the at least one graphene layer/structure 108, 108s, and possibly on the gate dielectric 440 and/or the stabilizer 444. The at least one electrode 446 may be electrically conductively connected to the at least one graphene layer/structure 108, 108s. The at least one electrode 446 may provide one of a source/drain contact of the transistor, and another source/drain contact of the transistor may be provided electrically contacting a bottom end 108b of the at least one graphene layer/structure 108, 108s, e.g. by an electrically conductive structure formed in the semiconductor body 102, e.g. the base 102b of the semiconductor body 102 (not shown). For example, the at least one electrode 446 may form the drain contact. In other words, the method of forming the transistor may further include electrically connecting the top end 108t of the at least one, e.g. cylindrical, graphene layer/structure 108, 108s to a first source/drain contact 446, and electrically connecting a bottom end 108b of the, e.g. cylindrical, graphene layer/structure 108, 108s to a second source/drain contact.

In various embodiments, vias, buried structures (not shown) or the like may be used for electrically contacting the gate 442.

Figure 5A:
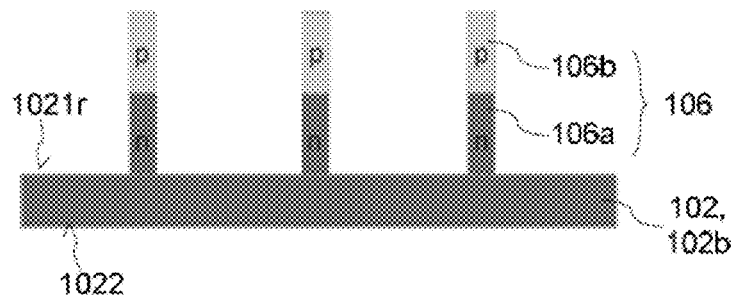
FIGS. 5A to 5C show various stages of a method of forming a graphene structure in accordance with various embodiments.
Figure 5B:
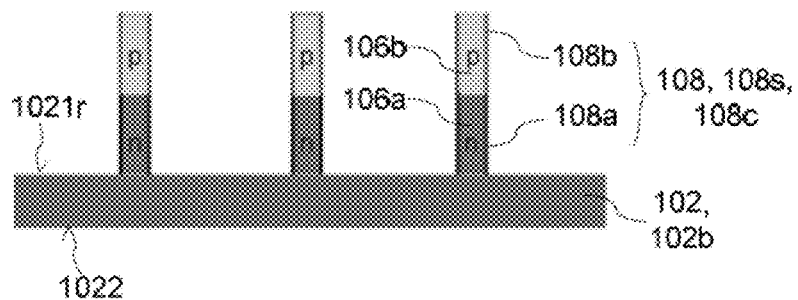
Figure 5C:
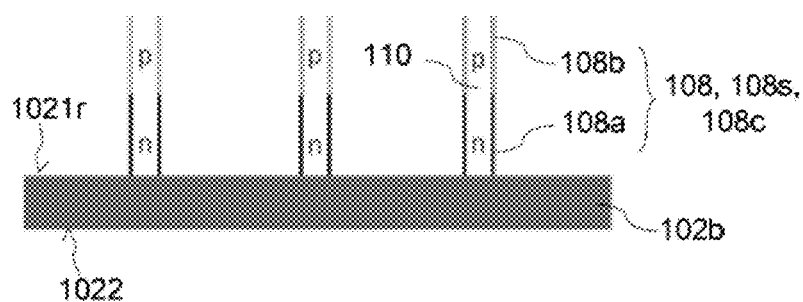

FIGS. 5A to 5C show various stages of a method of forming a graphene structure 108s (including portions 108a and 108b) in accordance with various embodiments.

Various components, materials, processes, parameters etc. applying to various embodiments shown in FIG. 5A to FIG. 5C may be similar or identical to those described above. Their description may not be repeated here.

As shown in FIG. 5A, the at least one protrusion 106 of the semiconductor body 102 may, in various embodiments, include doped regions, e.g. two doped regions 106a and 106b. In various other embodiments, the at least one protrusion 106 may include fewer or more doped regions. A first doped region 106a may be of a first conductivity type. A second doped region 106b may be of a second conductivity type. The first conductivity type may be an n-type conductivity type, and the second conductivity type may be a p-type conductivity type, as shown in FIG. 5A, or vice versa (not shown). An n-doping of the carbon-containing semiconductor material, e.g. silicon carbide, may for example be achieved by doping with group V atoms, e.g. arsenic or phosphorus. A p-doping of the carbon-containing semiconductor material, e.g. silicon carbide, may for example be achieved by doping with group III atoms, e.g. indium, gallium or aluminum.

In various embodiments, the first doped region 106a and the second doped region 106b may, as shown in FIG. 5A, be arranged vertically (e.g. stacked) in the at least one protrusion 106. Other arrangements of the doped regions 106a, 106b with the different conductivity types may be chosen, e.g. the first doped region 106a and the second doped region 106b may be arranged in different azimuthal directions of the at least one protrusion 106.

The method of forming a graphene structure may be carried out for example as described in an embodiment described above. This may, in various embodiments, result in at least one graphene layer 108 that may include a first doped region 108a of a first conductivity type and a second doped region 108b of a second conductivity type. The first doped region 108a of the at least one graphene layer 108 may form in a region where the at least one graphene layer 108 may be formed from the carbon-containing semiconductor material with the doping of the first conductivity type. The second doped region 108b of the at least one graphene layer 108 may form in a region where the at least one graphene layer 108 may be formed from the carbon-containing semiconductor material with the doping of the second conductivity type. In other words, a doping of the different doping regions 106a, 106b may be transferred to the at least one graphene layer 108, e.g. during the annealing of the semiconductor body 102. Thereby, a graphene structure 108s with doped regions 108a, 108b may be formed. For example, a carbon nanotube with doped regions 108a, 108b may be formed, i.e. a doped carbon nanotube.

In various embodiments, a pn-junction may be formed in the at least one graphene layer/structure 108, 108s. For example, a carbon nanotube with a pn-junction may be formed.

In various embodiments, as shown in FIG. 5C, the carbon-containing semiconductor material may be removed from inside the at least one doped graphene layer/structure 108, 108s, as described above. A semiconductor body 102, e.g. a base 102b of the semiconductor body 102, with at least one unfilled doped graphene layer/structure 108, 108s may thus be formed.

In various embodiments, the at least one unfilled doped graphene layer/structure 108, 108s may be detached from the base 102b of the semiconductor body 102 as described above.

In various embodiments, the at least one doped graphene layer/structure 108, 108s filled with the doped carbon-containing semiconductor material may be detached from the base 102b of the semiconductor body 102 as described above.

Figure 6A:
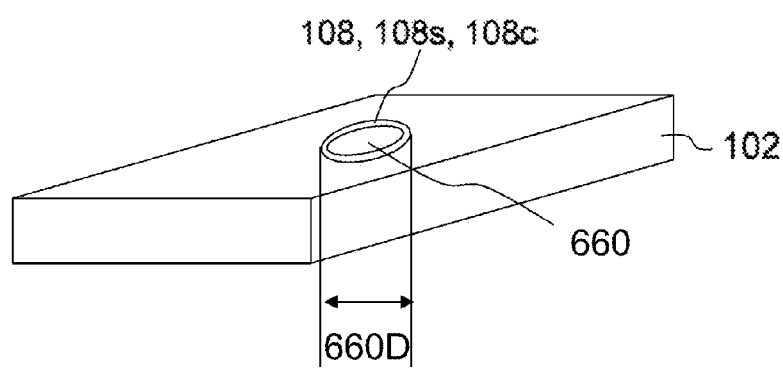
FIGS. 6A and 6B show various stages of a method of forming a graphene structure in accordance with various embodiments.
Figure 6B:
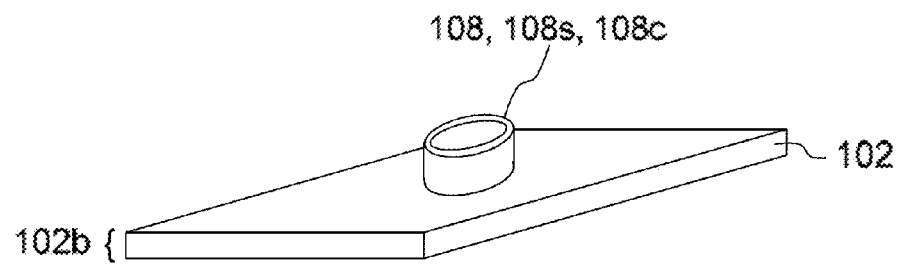

FIGS. 6A and 6B show various stages of a method of forming a graphene structure in accordance with various embodiments.

Various components, materials, processes, parameters etc. applying to various embodiments shown in FIGS. 6A and 6B may be similar or identical to those described above. Their description may not be repeated here.

As shown in FIG. 6A, an opening 660 may be formed in a body 102, e.g. in a semiconductor body, e.g. in a body containing carbon. The opening 660 may for example be etched, e.g. in a similar process as described above for forming the at least one protrusion. A graphene layer 108 may be formed on an inner peripheral surface of the opening 660 formed in the body 102, for example as described above for forming the graphene layer 108 on the outer peripheral surface 106o of the at least one protrusion 106.

As shown in FIG. 6B, in various embodiments, a portion of the body 102 outside the graphene layer 108 (which may form a closed surface) may be removed, for example by etching etc. as described above.

In various embodiments, the graphene layer 108 may be formed on the inner peripheral surface of the opening 660 formed in the body 102 with such a specific diameter 660D that a carbon nanotube 108c may form. In other words, the diameter 660D of the opening 660 may fulfill a specific relation. For example, the diameter 660D may be chosen to fulfill the relation $d=78.3\times((n+m)^2-n\times m)^{0.5}$ pm for a combination of integer values of m and n that may not both be zero.

In various embodiments, the graphene layer 108, e.g. the carbon nanotube 108c, may remain connected to a base 102b of the body 102, e.g. of the semiconductor body. Alternatively, the graphene layer 108, e.g. the carbon nanotube 108c, may be removed from the base 102b of the body 102, e.g. of the semiconductor body. Thereby, an unfilled carbon nanotube 108c, e.g. as shown in FIG. 3A, may be formed.

Figure 7:
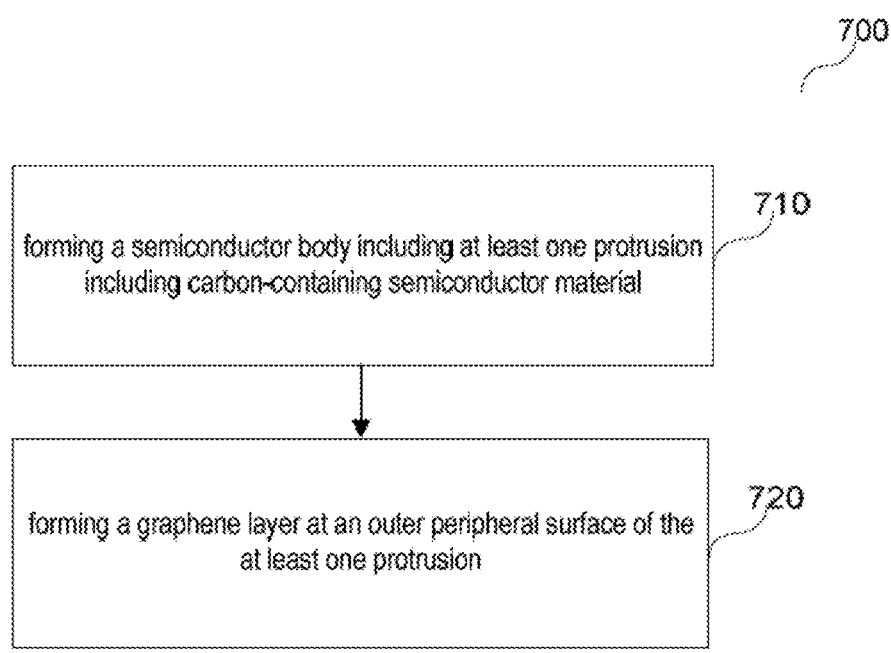
FIG. 7 shows a schematic diagram of a method of forming a graphene structure in accordance with various embodiments.

FIG. 7 shows a schematic diagram 700 of a method of forming a graphene structure in accordance with various embodiments.

As shown in FIG. 7, the method of forming a graphene structure may include forming a semiconductor body including at least one protrusion including carbon-containing semiconductor material (in 710).

The method may further include forming a graphene layer at an outer peripheral surface of the at least one protrusion (in 720).

Figure 8:
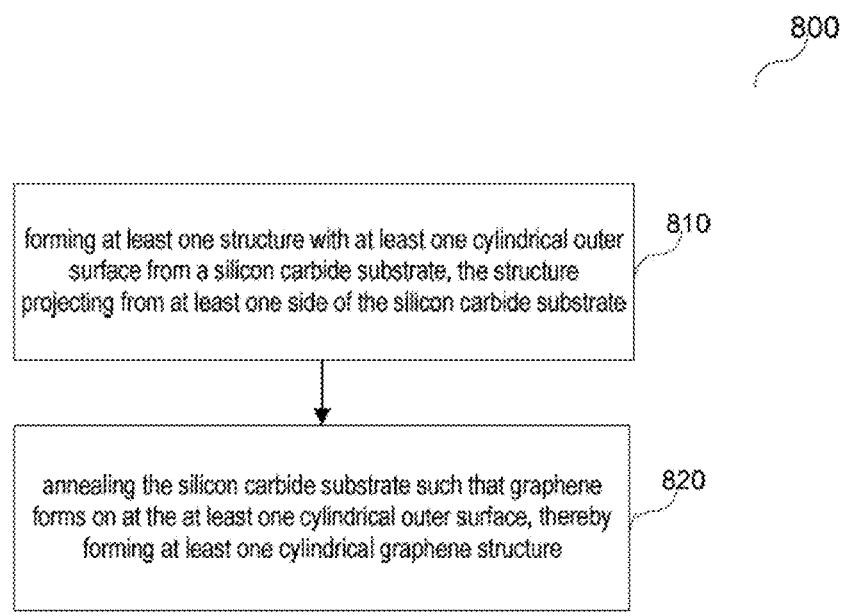
FIG. 8 shows a schematic diagram of a method of forming a graphene structure in accordance with various embodiments.

FIG. 8 shows a schematic diagram 800 of a method of forming a graphene structure in accordance with various embodiments.

As shown in FIG. 8, the method of forming a graphene structure may include forming at least one structure with at least one cylindrical outer surface from a silicon carbide substrate, the structure projecting from at least one side of the silicon carbide substrate (in 810).

The method may further include annealing the silicon carbide substrate such that graphene forms on at the at least one cylindrical outer surface, thereby forming at least one cylindrical graphene structure (in 820).

Figure 9:
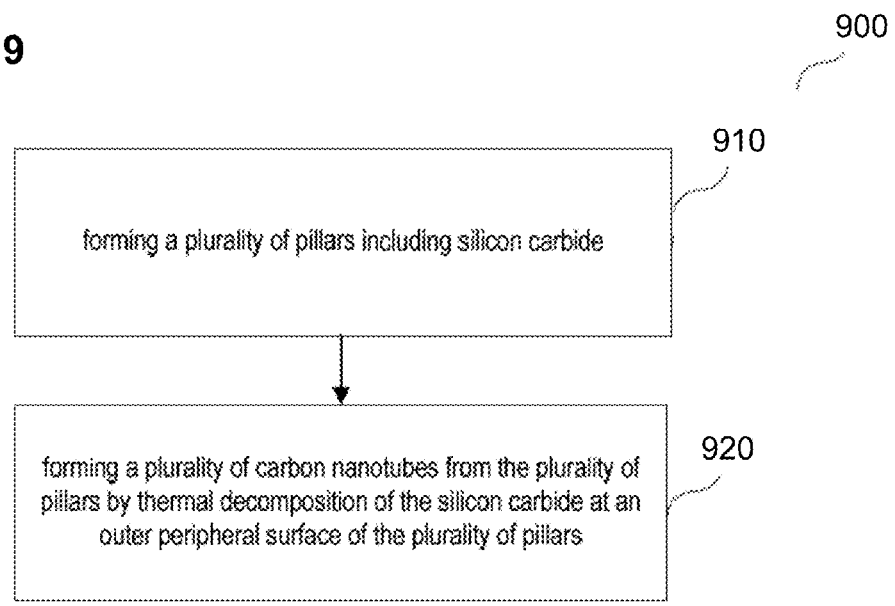
FIG. 9 shows a schematic diagram of a method of forming a graphene structure in accordance with various embodiments.

FIG. 9 shows a schematic diagram 900 of a method of forming a graphene structure in accordance with various embodiments.

As shown in FIG. 9, the method of forming a graphene structure may include forming a plurality of pillars including silicon carbide (in 910).

The method may further include forming a plurality of carbon nanotubes from the plurality of pillars by thermal decomposition of the silicon carbide at an outer peripheral surface of the plurality of pillars (in 920).

In various embodiments, a method of forming a graphene structure is provided. The method may include forming a body including at least one protrusion; and forming a graphene layer at an outer peripheral surface of the at least one protrusion. In various embodiments, the body may be a semiconductor body. In various embodiments, the at least one protrusion may include carbon-containing semiconductor material.

In various embodiments, a method of forming a graphene structure is provided. The method may include forming a semiconductor body including at least one protrusion including carbon-containing semiconductor material, and forming a graphene layer at an outer peripheral surface of the at least one protrusion. In various embodiments, the carbon-containing semiconductor material may be silicon carbide. In various embodiments, the forming of the graphene layer may include forming, by thermal decomposition of the silicon carbide, the graphene layer around the outer peripheral surface of the at least one protrusion from the silicon carbide of the at least one protrusion. In various embodiments, the semiconductor body may include a semiconductor substrate, wherein forming the at least one protrusion may include forming at least one trench in the semiconductor substrate. In various embodiments, the semiconductor body may include a semiconductor substrate, wherein forming the at least one protrusion may include epitaxially growing the at least one protrusion on the semiconductor substrate. In various embodiments, the graphene layer at an outer peripheral surface of the at least one protrusion forms a closed surface. In various embodiments, the method may further include removing a portion of the protrusion that resides within the graphene layer. In various embodiments, the removing the portion of the protrusion may include etching. In various embodiments, the method may further include forming an opening in the at least one protrusion, and forming a graphene layer on a surface of the opening. In various embodiments, the graphene layer may include at least one carbon nanotube. In various embodiments, the forming of the graphene layer may include annealing of the semiconductor body. In various embodiments, one or more process parameters of the annealing may be adjusted such that the at least one carbon nanotube is configured as a single-walled carbon nanotube. In various embodiments, one or more process parameters of the annealing may be adjusted such that the at least one carbon nanotube is configured as a multi-walled carbon nanotube. In various embodiments, the process parameters of the annealing may include at least one of an annealing temperature, an annealing duration, an atmospheric pressure, and constituents of the atmosphere. In various embodiments at least one of a width of the protrusion, a shape of the protrusion, a crystal orientation of the semiconductor body, and a surface termination of the protrusion may be selected or adjusted such that the at least one carbon nanotube is a single-walled carbon nanotube or a multi-walled carbon nanotube. In various embodiments, the annealing temperature may be in a range from about 1150° C. to about 1800° C. In various embodiments, the annealing duration may be in a range from about 5 minutes to about 60 minutes. In various embodiments, the carbon-containing semiconductor material may be silicon carbide, and the surface termination of the at least one semiconductor structure may be silicon. In various embodiments, the at least one protrusion may include a first doped region having a first conductivity type, and a second doped region having a second conductivity type. In various embodiments, a diameter d of the protrusion may be chosen to fulfill the relation $d=78.3\times((n+m)^2-n\times m)^{0.5}$ pm, wherein n and m may be integer values, at least one of n and m being greater than 0. In various embodiments, $n=m$, $n\neq 0$, $m\neq 0$. In various embodiments, $m=0$, $n\neq 0$. In various embodiments, $n\neq m$, $m\neq 0$, $n\neq 0$. In various embodiments, the method may further include detaching the at least one protrusion from a remaining portion of the semiconductor body after the forming of the graphene layer. In various embodiments, the method may further include detaching the at least one graphene layer from a remaining portion of the semiconductor body. In various embodiments, the at least one detached graphene layer may include a plurality of graphene layers of essentially equal length. In various embodiments, the outer peripheral surface of the at least one protrusion may be cylindrical. In various embodiments, the outer peripheral surface of the at least one protrusion may be circularly cylindrical or polygonal. In various embodiments, at least one physical property of the graphene layer may vary in an azimuthal direction of the protrusion.

In various embodiments, a method of forming a graphene structure is provided. The method may include forming at least one structure with at least one cylindrical outer surface from a silicon carbide substrate, the structure projecting from at least one side of the silicon carbide substrate; and annealing the silicon carbide substrate such that graphene forms at the at least one cylindrical outer surface, thereby forming at least one cylindrical graphene structure.

In various embodiments, a method of forming a graphene structure is provided. The method may include forming a plurality of pillars containing silicon carbide, and forming a plurality of carbon nanotubes from the plurality of pillars by thermal decomposition of the silicon carbide at an outer peripheral surface of the plurality of pillars.

In various embodiments, a carbon nanotube arrangement is provided. The carbon nanotube arrangement may include a plurality of carbon nanotubes disposed over a silicon carbide substrate, wherein an outer surface of the carbon nanotubes is uncovered. In various embodiments, the carbon nanotubes may be filled with silicon carbide.

In various embodiments, a method of forming a graphene structure is provided. The method may include forming at least one opening in a body; forming a graphene layer at an inner peripheral surface of the at least one opening; and at least partially removing the body from an outer peripheral surface of the graphene layer. In various embodiments, the body may include or may be made from silicon carbide. In various embodiments, the opening may be cylindrical.

In various embodiments, a method of forming a graphene structure is provided. The method may include forming at least one cylindrical opening in a body, wherein a diameter of the opening may be chosen to fulfill the relation $d=78.3\times((n+m)^2-n\times m)^{0.5}$ pm, wherein n and m are integer values, at least one of n and m being greater than 0; and forming a graphene layer at an inner peripheral surface of the at least one opening. In various embodiments, the body may include or may be made from silicon carbide.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of forming a graphene structure, comprising:
    forming a body comprising a base and at least one protrusion extending from the base, wherein the body is a semiconductor body and the at least one protrusion comprises carbon-containing semiconductor material, wherein the carbon-containing semiconductor material is silicon carbide; and
    forming, by thermal decomposition of the silicon carbide, a graphene layer surrounding an outer peripheral surface of the at least one protrusion from the silicon carbide of the at least one protrusion, wherein the graphene layer extends vertically and perpendicular to the base and comprises at least one carbon nanotube, wherein a relative orientation of the silicon carbide and the at least one protrusion is such that faces of the outer surface of the at least one protrusion comprise a C-face and a Si-face, wherein the C-face and/or the Si-face are parallel to a (0001) plane of the silicon carbide.

2. The method of claim 1,
wherein forming the body comprising the at least one protrusion comprises providing a substrate, and forming at least one trench in the substrate.

3. The method of claim 1,
wherein forming the body comprising the at least one protrusion comprises providing a substrate, and epitaxially growing the at least one protrusion on the substrate.

4. The method of claim 1, further comprising:
removing a portion of the protrusion that resides within the graphene layer.

5. The method of claim 1, further comprising:
forming an opening in the at least one protrusion; and forming a graphene layer on a surface of the opening.

6. The method of claim 1,
wherein the graphene layer at an outer peripheral surface of the at least one protrusion forms a closed surface.

7. The method of claim 1,
wherein forming the graphene layer comprises annealing the body.

8. The method of claim 7,
wherein one or more process parameters of the annealing are adjusted such that the at least one carbon nanotube is configured as a single-walled carbon nanotube.

9. The method of claim 8,
wherein the process parameters of the annealing comprise at least one of an annealing temperature, an annealing duration, an atmospheric pressure, and constituents of the atmosphere.

10. The method of claim 7,
wherein an annealing temperature is in a range from about 1150° C. to about 1800° C.

11. The method of claim 7,
wherein an annealing duration is in a range from about 5 minutes to about 60 minutes.

12. The method of claim 7,
wherein the at least one protrusion comprises silicon carbide, and a surface termination of the at least one protrusion is silicon.

13. The method of claim 1, wherein the at least one protrusion comprises a first doped region having a first conductivity type, and a second doped region having a second conductivity type.

14. The method of claim 1,
wherein a diameter d of the protrusion is chosen to fulfill the relation $d=78.3\times((n+m)^2-n\times m)^{0.5}$ pm, wherein n and m are integer values, at least one of n and m being greater than 0.

15. The method of claim 1, further comprising:
detaching the at least one protrusion from a remaining portion of the body after forming the graphene layer.

16. The method of claim 4, further comprising:
detaching at least one graphene layer from a remaining portion of the body.

17. The method of claim 1,
wherein the outer peripheral surface of the at least one protrusion is cylindrical.

18. The method of claim 1,
wherein at least one physical property of the graphene layer varies in an azimuthal direction of the protrusion.

19. A method of forming a graphene structure, the method comprising:
forming at least one structure with at least one cylindrical outer surface from a silicon carbide substrate, the at least one structure projecting from at least a base of the silicon carbide substrate; and annealing the silicon carbide substrate so that graphene forms at the at least one cylindrical outer surface so as to form at least one cylindrical graphene structure, the straight cylindrical structure extending perpendicular to the base, wherein the graphene comprises at least one carbon nanotube, wherein a relative orientation of the silicon carbide and the at least one structure is such that faces of the outer surface of the at least one structure comprise a C-face and a Si-face, wherein the C-face and/or the Si-face are parallel to a (0001) plane of the silicon carbide.

* * * * *